United States Patent

Takahashi

[11] Patent Number: 6,046,614
[45] Date of Patent: Apr. 4, 2000

[54] DRIVE CIRCUIT HAVING A POWER RECOVERY SYSTEM

[75] Inventor: Kenichiro Takahashi, Tokyo, Japan

[73] Assignee: NEC Corporation, Tokyo, Japan

[21] Appl. No.: 09/052,154

[22] Filed: Mar. 31, 1998

[30] Foreign Application Priority Data

Mar. 31, 1997 [JP] Japan ................................ 9-080545

[51] Int. Cl.⁷ ................................................. H03B 1/00
[52] U.S. Cl. ........................... 327/111; 327/404; 327/438
[58] Field of Search ................................. 327/111, 438, 327/403, 404, 405, 108, 109, 110, 112, 419; 345/76, 79; 315/169.3; 340/825.81

[56] References Cited

U.S. PATENT DOCUMENTS 5,148,049  9/1992  Okutsu et al. ........................... 327/111

FOREIGN PATENT DOCUMENTS 2-168865  6/1990  Japan .
5-265397  10/1993  Japan .
8-137432  5/1996  Japan .
9-62226  3/1997  Japan .

OTHER PUBLICATIONS

By Y. Fujioka et al., "Bidirectional Push–Pull Symmetric Driving System of TF–EL Display", *Sharp Technical Report*, 1987, pp. 61–65.

Primary Examiner—Kenneth B. Wells
Assistant Examiner—Minh Nguyen
Attorney, Agent, or Firm—Young & Thompson

[57] ABSTRACT

A drive circuit for driving scanning lines or data lines in an EL or plasma display panel has a pair of power recovery lines each connected to a corresponding one of two thyristors. The first thyristor recovers electric power from the scanning line and the second thyristor supplies the electric power to another scanning line. The lower ON-resistance and lower parasitic capacitance of the thyristors provides an efficient recovery of the electric power while suppressing a latch-up failure of CMOSFETs.

13 Claims, 8 Drawing Sheets

DRIVE CIRCUIT HAVING A POWER RECOVERY SYSTEM

BACKGROUND OF THE INVENTION (a) Field of the Invention

The present invention relates to a drive circuit having a power recovery system and, more particularly, to a drive circuit for driving a capacitive load such as scanning electrodes or data electrodes in an electroluminescence display panel (ELDP) or a plasma display panel (PDP).

(b) Description of the Related Art

VGA monochrome ELDP or PDP systems have 480 scanning electrodes extending parallel to one another in the horizontal direction and 640 data electrodes extending parallel to one another in the vertical direction on a display panel. Each pixel element is disposed at the intersection between one of the scanning electrodes and one of the data electrodes. A pair of drive circuits are generally provided each for driving scanning lines connected to respective scanning electrodes or data lines connected to respective data electrodes to turn on or off each pixel element.

The ELDPs and PDPs generally utilize a high electric field for controlling each pixel element, and accordingly, have a large parasitic capacitance in the scanning lines or data lines due to the arrangement of the electrodes. For example, an ELDP has a parasitic capacitance as high as 3000 pF involved in each scanning line. In the operation of the drive circuit, the electric power once provided to a scanning electrode or data electrode is recovered to charge another scanning electrode or data electrode.

A technique for driving scanning lines or data lines in an ELDP is described in, for example, "38th Sharp Technical Report" pp61–65, 1987. FIG. 1 shows the basic configuration of the drive circuit described in the report. An integrated circuit (IC) 101 implementing a drive circuit in an ELDP comprises a pair of source terminals 2 and 3 for receiving a high potential VDD2 (240 volts) and a low potential VSS2 (0 volt), respectively, of a high-voltage source, and a plurality of (480, for example) drive sections DS1-DS3 each having a high-voltage CMOSFET including a p-MOSFET 107 and an n-MOSFET 108 for driving, through an output terminal 104–106, a corresponding one of the scanning lines represented as capacitors 111–113. A parasitic diode 109 or 110 is formed between the source and drain of each of the MOSFETs.

FIGS. 2A and 2B show the operations of one of the drive sections DS1–DS3 in FIG. 1 in a positive potential mode. FIG. 2A illustrates a step for raising the potential of the scanning line 111 up to 240 volts and FIG. 2B illustrates a subsequent step for lowering the potential of the scanning line 111 from 240 volts to 0 volt. In FIG. 2A, the source voltage is maintained at 240 volts, and this voltage is applied through the p-MOSFET 107, which is ON, through a current path designated by numeral 114. In FIG. 2B, the source potential VDD2 is lowered down to 0 volt, with the p-MOSFET 107 being maintained ON, thereby recovering the electric charge stored in the scanning line 111 through the current path designated by numeral 115 including the parasitic diode 109 to the high potential source line VDD2. The recovered charge can be used for the next step for charging another scanning line from the high potential source line VDD2 to thereby save the electric power.

If the electric charge is drained to the low potential line VSS2 instead, as shown by a dotted line 116 in FIG. 2B, the electric power cannot be recovered and this configuration is not generally employed in ELDP or PDP. A negative potential mode is generally combined alternately with the positive potential mode described above. In the negative potential mode, the scanning line is applied with 0 volt or −180 volts depending on the data to be displayed. The data lines are similarly driven by a similar drive circuit having a lower voltage configuration, wherein the source line VDD2 is applied with 60 volts or 0 volt.

In the operation of the ELDP wherein 60 image frames are displayed for every second, for example, the electric power Prs which can be recovered from the scanning line is a mean of the recovered power Prs(pos) in the positive potential mode and the recovered power Prs(neg) in the negative potential mode. Recovered powers Prs(pos) and Prs(neg) can be expressed by the function of $C_s$ (capacitance (pF) of each scanning line), $\Delta V$ (source voltage), $N_f$ (number of image frames per second), Ns (number of scanning lines) and $\eta_1$ (efficiency), for example, as follows:

$$Prs(pos) = (1/2) \times C_s \times \Delta V_1^2 \times N_f \times N_s \times \eta_1$$
$$= (1/2) \times 3000 \times 240^2 \times 60 \times 480 \times 0.75$$
$$= 1.87 \text{(watt)}$$

$$Prs(neg) = (1/2) \times C_s \times \Delta V_2^2 \times N_f \times N_s \times \eta_1$$
$$= (1/2) \times 3000 \times 180^2 \times 60 \times 480 \times 0.75$$
$$= 1.05 \text{(watt)}$$

The electric power can be also recovered from the data lines and depends on the contents of the image data then provided. The electric power Prd recovered from the data lines can be calculated as Prd=2.80 watts from the equation as recited below if the coefficient $\eta_2$, which depends on the contents of the image data, is assumed at $\eta_2$=0.05.

$$Prd = (1/2) \times C \times \Delta V_1^2 \times N_f \times N_s \times \eta_2$$
$$= (1/2) \times (2250/480) \times 60^2 \times 60 \times 480 \times \eta_2$$
$$= 56.0 \eta_2 \text{(watt)}$$

In the positive potential mode, the pixel elements disposed on the selected scanning line which is applied with 240 volts and having data of "L" (corresponding to 0 volts) on the data line are subjected to 240 volts, which exceeds the threshold voltage of 210 volts, resulting in ON state of the pixel elements for discharge thereof. On the other hand, the pixel elements disposed on the selected scanning line and having data of "H" (corresponding to 60 volts) on the data line are subjected to 180 volts, which is below the threshold voltage, resulting in OFF state of the pixel elements.

In the negative potential mode, the pixel elements disposed on the selected scanning line which is applied with −180 volts and having data of "L" (corresponding to 0 volt) on the data line are subjected to 180 volts to be turned OFF, whereas the pixel elements disposed on the selected scanning line and having data of "H" (corresponding to 60 volts) on the data line are subjected to 240 volts to be turned ON for discharge.

In the above conventional technique for recovering electric power from the scanning lines or data lines by switching the voltage of the source lines, the output voltage from the drive circuit tends to exceed the high potential source voltage VDD2 or become below the low potential source voltage VSS2 as a result of the source line being fixed to the source potential VDD2 and the voltage drop of the recovery current. In this case, a latch-up failure sometime arises in the CMOSFET, which must be suppressed by the design of the CMOSFET and increases the occupied area for the CMOSFETs.

In addition, the current recovered from a scanning line or a data line corresponds in magnitude to several hundreds times the current supplied to other scanning line or data line, and further, the capacitance of the scanning line or data line from which electric power is recovered is large due to the floating state of the scanning line or data line. As a result, electric charge is stored on the junction capacitance of the parasitic diodes associated with the output transistors, which retards an efficient recovery of the electric power from the scanning lines.

SUMMARY OF THE INVENTION

It is therefore an object of the present invention to provide a drive circuit having therein a power recovery system capable of efficiently recovering electric power from a capacitive load, such as scanning lines or data lines in an ELDP or PDP etc., while suppressing a latch-up failure of CMOSFETs.

The present invention provides a drive circuit for driving a plurality of capacitive loads, such as scanning lines or data lines in an ELDP or PDP system. The drive circuit comprises a first switching transistor, connected between a first source line and an output line connected to one of the capacitive loads, for supplying electric power from the first source line to the one of the capacitive loads through the output line, a first thyristor having an anode connected to the output line, a first power recovery line connected to the cathode of the first thyristor, and a power recovering block connected to the first power recovery line for recovering the electric power supplied through the first power recovery line.

In accordance with the present invention, the thyristor recovering the electric power from the load has a lower ON-resistance compared to a diode, which less raises the voltage of the output line and suppresses a latch-up failure when used in a CMOS device. The junction capacitance between the anode and the cathode of the thyristor is as low as, for example, about ⅓ of the junction capacitance of a diode, which saves wasted electric power in the power recovery system.

The above and other objects, features and advantages of the present invention will be more apparent from the following description, referring to the accompanying drawings.

DESCRIPTION OF THE PREFERRED EMBODIMENTS

Figure 1:
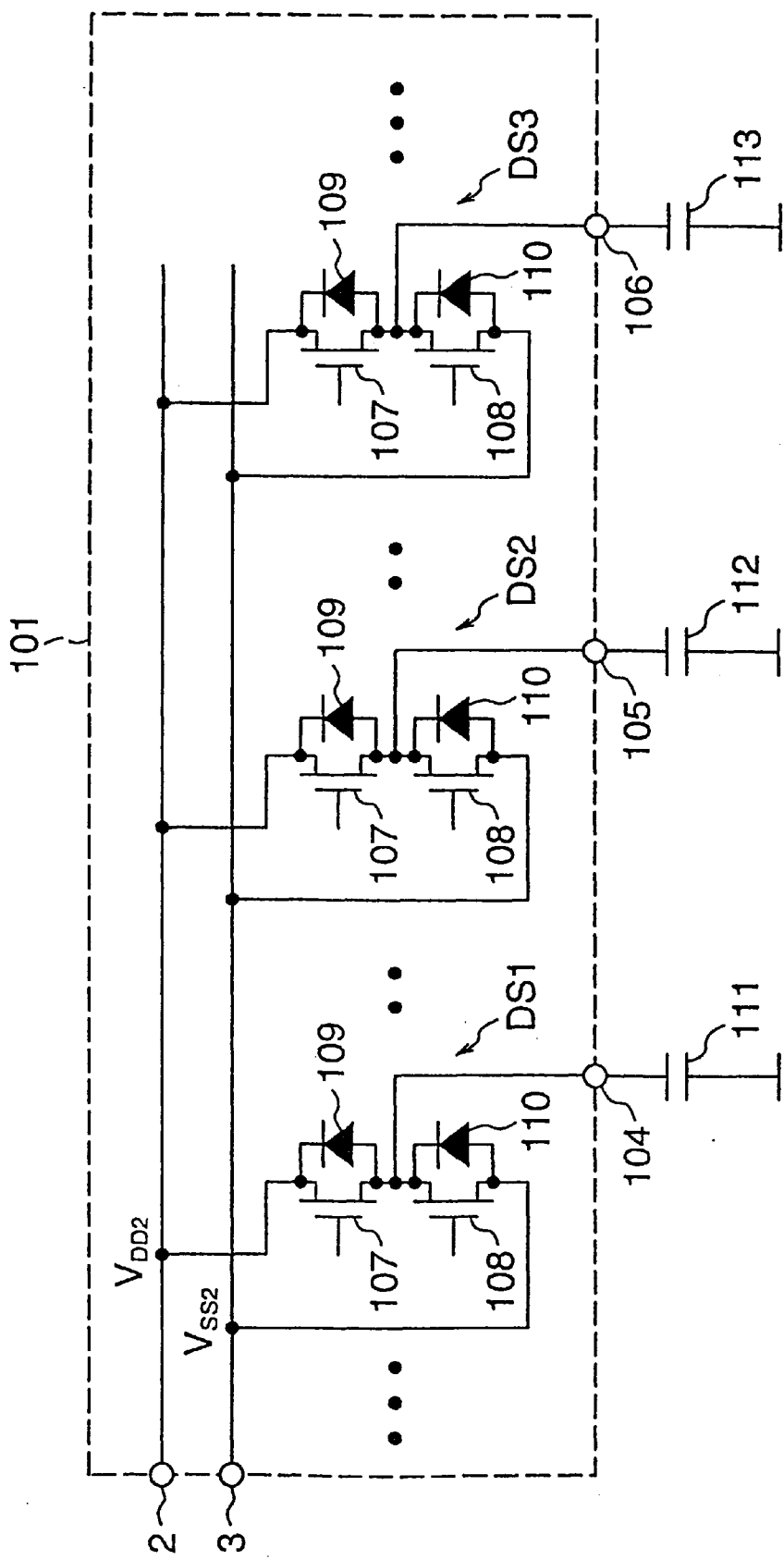
FIG. 1 is a schematic diagram of a drive circuit, having a power recovery system, for driving scanning lines in an ELDP.
Figure 2A:
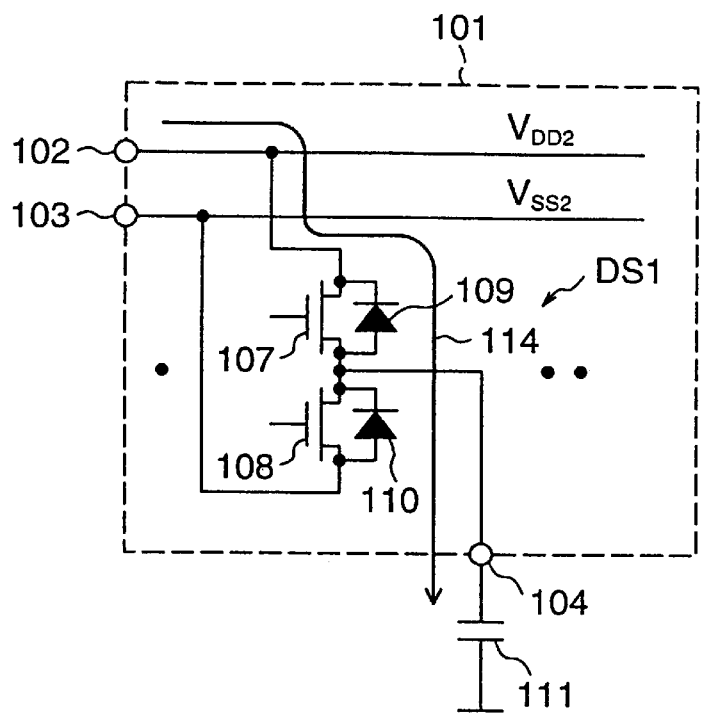
FIG. 2A is an operational diagram of the drive circuit of FIG. 1 during driving one of the scanning lines.
Figure 2B:
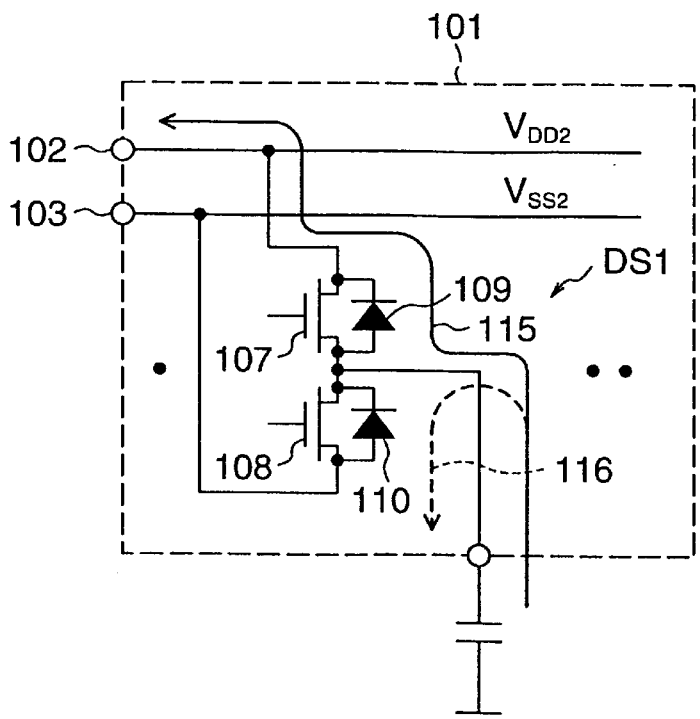
FIG. 2B is another operational diagram of the drive circuit of FIG. 1 during recovering electric power from the one of the scanning lines.

Now, the present invention is more specifically described with reference to accompanying drawings, wherein similar constituent elements are designated by the same or similar reference numerals.

Figure 3:
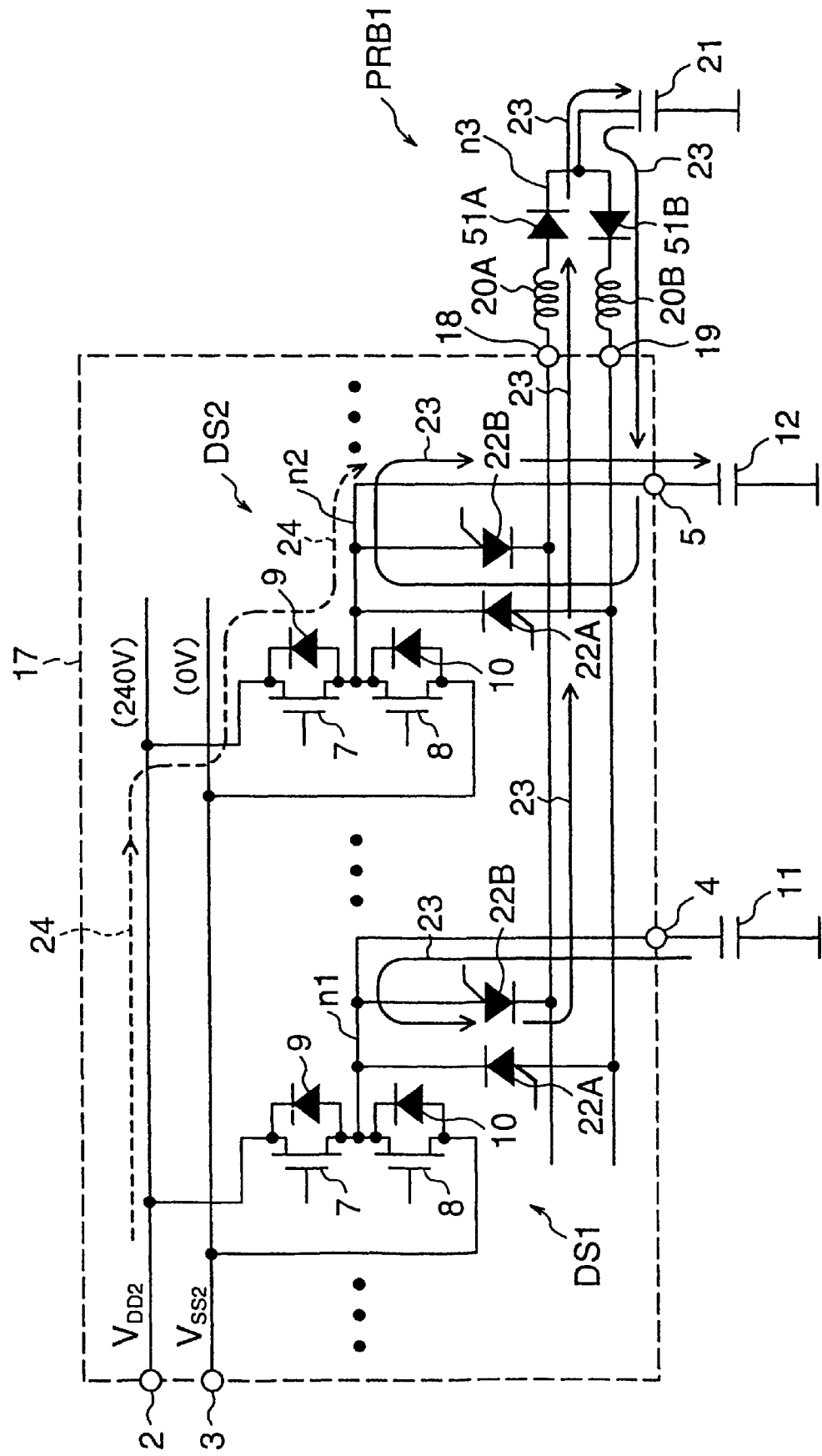
FIG. 3 is a schematic diagram of a drive circuit according to an embodiment of the present invention during operation in a positive potential mode.

Referring to FIG. 3, a drive circuit for driving a capacitive load, such as scanning lines in an ELDP, according a first embodiment of the present invention comprises a pair of high-voltage source lines VDD2 and VSS2 connected to input terminals 2 and 3 of the drive circuit, a pair of power recovery lines 18 and 19, and a plurality of drive sections DS1 and DS2 each corresponding to one of scanning lines designated by numerals 11 and 12, all of which are formed on a single semiconductor chip 17. The drive circuit also comprises a power recovery block PRB1 outside the semiconductor chip 17.

Each drive section DS1 or DS2 comprises a CMOSFET including a pMOSFET 7 and an nMOSFET 8, both of which are associated with respective parasitic diodes 9 and 10, and having an output node n1 or n2 connected to a corresponding scanning line 11 or 12. Each drive section DS1 or DS2 also comprises a pair of thyristors including a first thyristor 22A having an anode connected to power recovery line 19 and a cathode connected to the output node n1 of the CMOSFET and a second thyristor 22B having an anode connected to the output node n1 and a cathode connected to power recovery line 18.

The power recovery block PRB1 comprises a first diode 51A having an anode connected to power recovery line 18 through a first reactor (or inductance element) 20A, a second diode 51B having a cathode connected to power recovery line 19 through a second reactor 20B and an anode connected to the cathode of the first diode 51A at node n3, and a storage capacitor 21 connected between the node n3 and the ground. The power recovery block PRB1 functions as an LC resonance circuit.

Although two drive sections DS1 and DS2 corresponding to the scanning lines 11 and 12 are illustrated in FIG. 3, a large number of, for example, several dozens to about 200, drive sections are disposed in the semiconductor chip 17 for driving respective scanning lines. The drive circuit of FIG. 3 may be provided for data lines in an ELDP instead. In FIG. 3, numerals 23 and 24 denote the flow of current in the drive circuit during a period for charging the scanning line 12 while discharging the scanning line 11.

The discharge current from the scanning line 11 flows through second thyristor 22B of the drive section DS1, power recovery line 18, first reactor 20A, first diode 51A, second diode 51B, second reactor 20B, power recovery line 19 and first thyristor 22A of the drive section DS2, to charge the scanning line 12 by the power recovery function of the drive circuit, while temporarily storing the electric charge on the storage capacitor 21. The power loss during operation of the drive circuit is supplemented from the high potential source line VDD2 by the current designated by dotted line 24 in the positive potential mode of FIG. 3.

Figure 4:
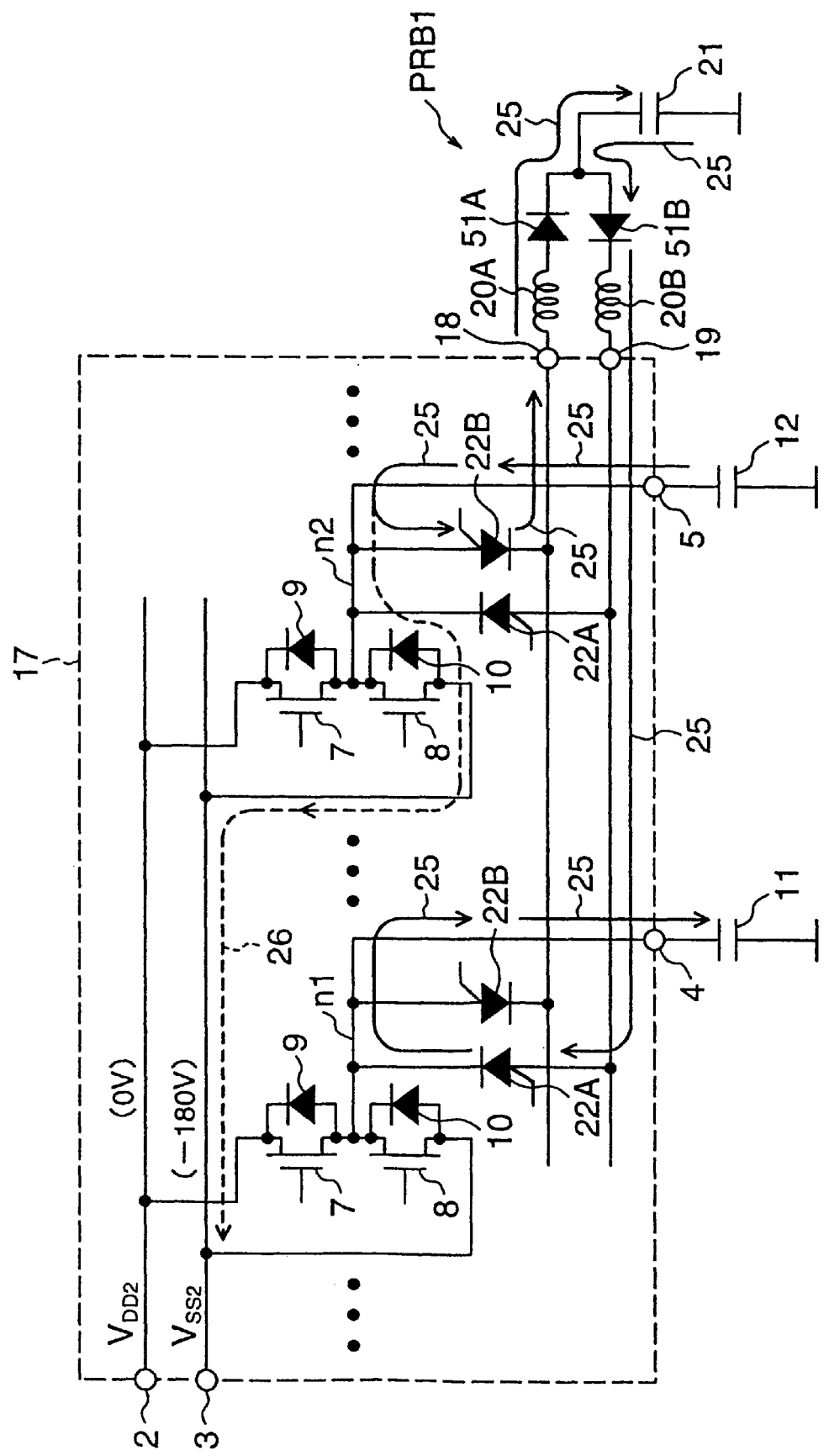
FIG. 4 is another schematic diagram of the drive circuit of FIG. 3 during operation in a negative potential mode.

Referring to FIG. 4 showing the operation in a negative potential mode of the drive circuit of FIG. 3 occurring alternately with the positive potential mode, the source lines VDD2 and VSS2 are applied with 0 volt and −180 volts, respectively. The discharge current from the scanning line 12 flows through second thyristor 22B of the drive section DS2, power recovery line 18, first reactor 20A, first diode 51A, second diode 51B, second reactor 20B, power recovery line 19 and second thyristor 22A of the drive section DS1, to charge the scanning line 11. The power loss during the operation of the drive circuit is supplemented by the current 26 flowing toward source line VSS2 in the negative potential mode of FIG. 4.

The control circuit for controlling the gates of the thyristors 22A and 22B are provided as a low-voltage control circuit, together with a logic circuit including a shift register and latch circuits generally used for an input stage of the drive circuit. Accordingly, a timing generator etc. of the logic circuit can be also used for controlling the drive timing for the gates of the thyristors 22A and 22B.

The inductance of the reactors 20A and 20B and the capacitance of the storage capacitor 21 are designed based on a resonance frequency which also depends on the capacitance of the scanning lines 11 and 12. The resonance frequency is determined to approximately coincide with the scanning frequency of the drive circuit for effectively recovering the electric power.

Figure 5:
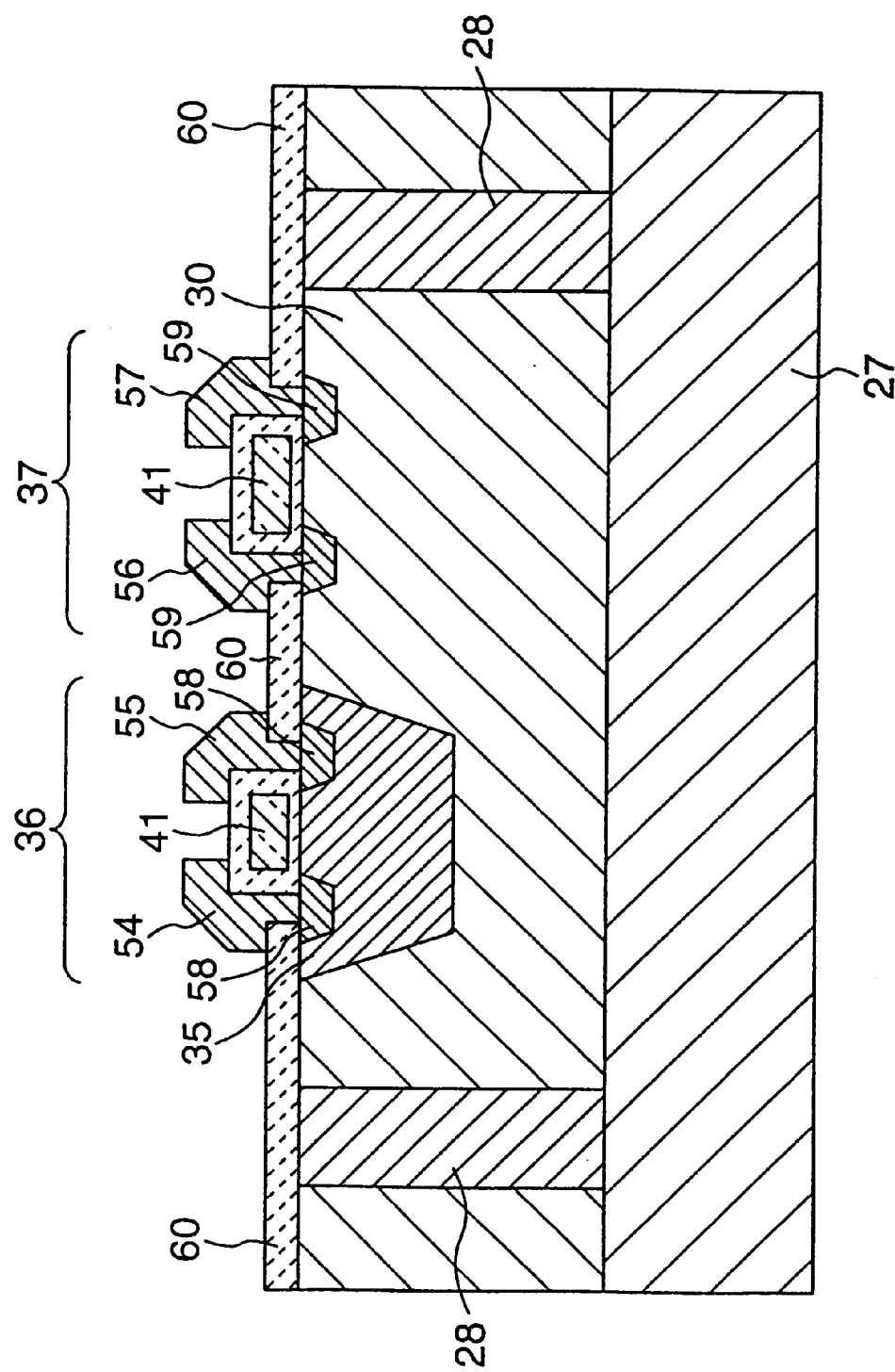
FIG. 5 is a cross-sectional view of a low voltage CMOSFET in the drive circuit of FIG. 3.
Figure 6:
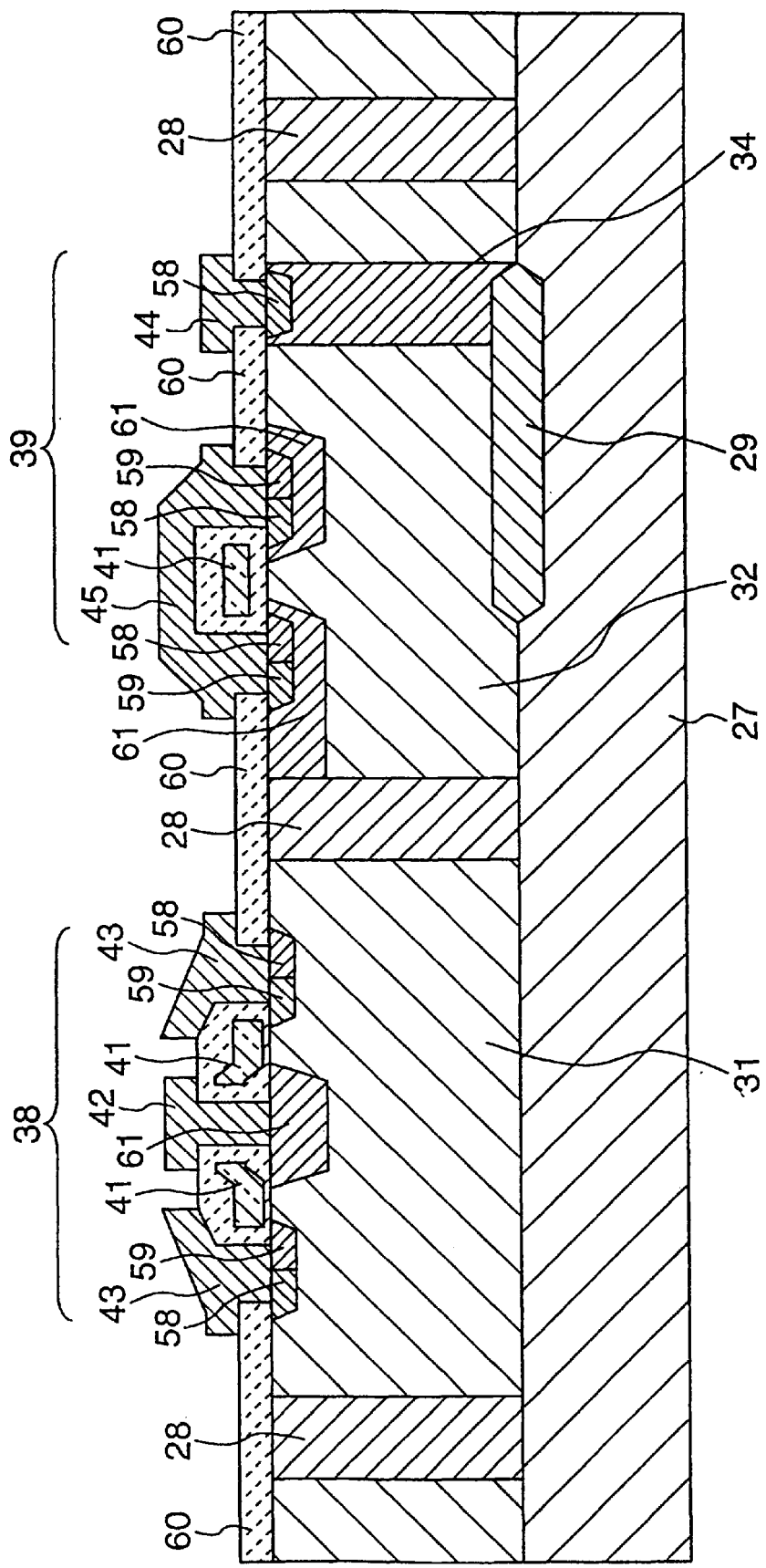
FIG. 6 is a cross-sectional view of a high-voltage CMOSFET in the drive circuit of FIG. 3.
Figure 7:
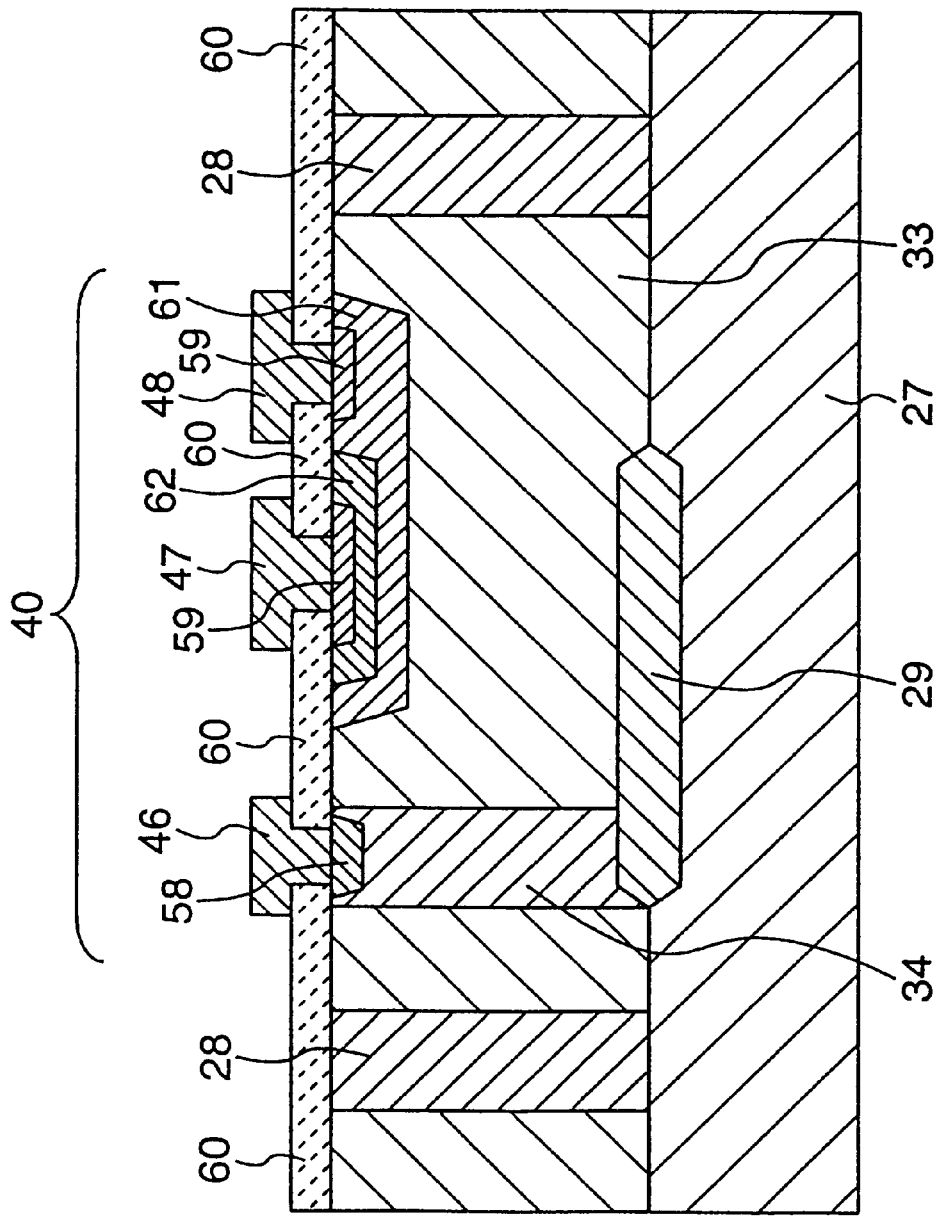
FIG. 7 is a cross-sectional view of a high-voltage thyristor in the drive circuit of FIG. 3.

Referring to FIGS. 5 to 7, there are shown cross-sections of respective portions of the drive circuit of FIG. 3. The drive circuit comprises a p-type semiconductor substrate 27, an n-type epitaxial layer formed on the semiconductor substrate 27 and separated by a plurality of separating p-type diffused regions 28 into a plurality of island regions (islands) 30 to 33. Identical numerals in these drawings denotes regions or layers formed in a common step.

FIG. 5 shows one of the islands, or island 30, for receiving a low-voltage CMOSFET used in a shift register, a latch circuit or timing control circuit disposed in the drive circuit . The CMOSFET includes an nMOSFET 36 having heavily doped source/drain regions 58 in a p-well 35 formed in the island 30, a gate 41, a drain electrode 54 and a source electrode 55, and a pMOSFET 37 having heavily doped source/drain regions 59 in the island 30, a gate 41, a drain electrode 56 and a source electrode 57. In FIG. 5, each gate 41 has a length of 1 $\mu$m, and a gate insulating film has a thickness of 20 to 30 nm, for example, which are generally used in the current CMOSFET technique. Numeral 60 denotes an interlevel dielectric film formed on the epitaxial layer.

FIG. 6 shows a pair of islands 31 and 32 for receiving a high-voltage CMOSFET including a pMOSFET 38 and an nMOSFET 39. The pMOSFET 38 is formed of an off-set structure suited to a high withstand voltage, wherein the pMOSFET 38 comprises an extended drain 61 interposed between a pair of source regions 59, with a gate 41 disposed for each source region 59 and the extended drain 61. The source region 59 is associated with a heavily doped n-type region 58 which is also connected to a source electrode 43 for maintaining the island 31 of the epitaxial layer at a high potential.

The high-voltage nMOSFET 39 is formed as VDMOS (vertical structure/diffused-type MOS) and has a pair of heavily doped n-type source regions 58 and an associated pair of heavily doped p-type regions 59, which are formed in moderately doped p-type regions 61 and connected to a source electrode 45, a heavily doped n-type drain region 29 of a buried layer connected to a drain electrode 44 through a heavily doped contact regions 34 and 58 formed in the island 32 of the epitaxial layer, and a gate 41. The p-type diffused regions 61 is maintained at the ground potential to maintain in turn the separating p-type region 28 at the ground potential. A CMOSFET used in a level shift section for converting a 0–5 volt signal to a 0–150 volt signal in the ELDP system has also the structure shown in FIG. 6.

FIG. 7 shows an island 33 of the epitaxial layer disposed for receiving a thyristor 40. The thyristor 40 comprises an anode electrode 47, a pair of heavily doped p-type regions 59 constituting the anode of the thyristor 40, a moderately doped n-type layer 62, a moderately doped p-type layer 61, and a moderately doped n-type layer constituting the cathode of the thyristor and implemented by the island 33 of the epitaxial layer, which are consecutively disposed from the top to the bottom. One of the heavily doped p-type regions 59 is connected to a gate electrode 48 for controlling the operation of the thyristor 40. The bottom n-type layer 33 is connected to a cathode electrode 46 through a heavily doped n-type region 29 of a buried layer and heavily doped contact regions 34 and 58. The p-n-p-n layers 59, 62, 61 and 33 of the thyristor 40 are formed during the steps for forming the diffused regions for the high-voltage CMOSFET of FIG. 6, which means that the thyristor 40 can be formed substantially without complicating the step for the drive circuit.

The separating p-type diffused regions 28 are maintained at the ground potential by applying the VSS2 to the source regions 58 of the high voltage nMOSFET 39, as mentioned above, for separating the epitaxial layer into the respective n-type islands 30 to 33, which are maintained at a potential higher than VSS2 at any time.

Figure 8:
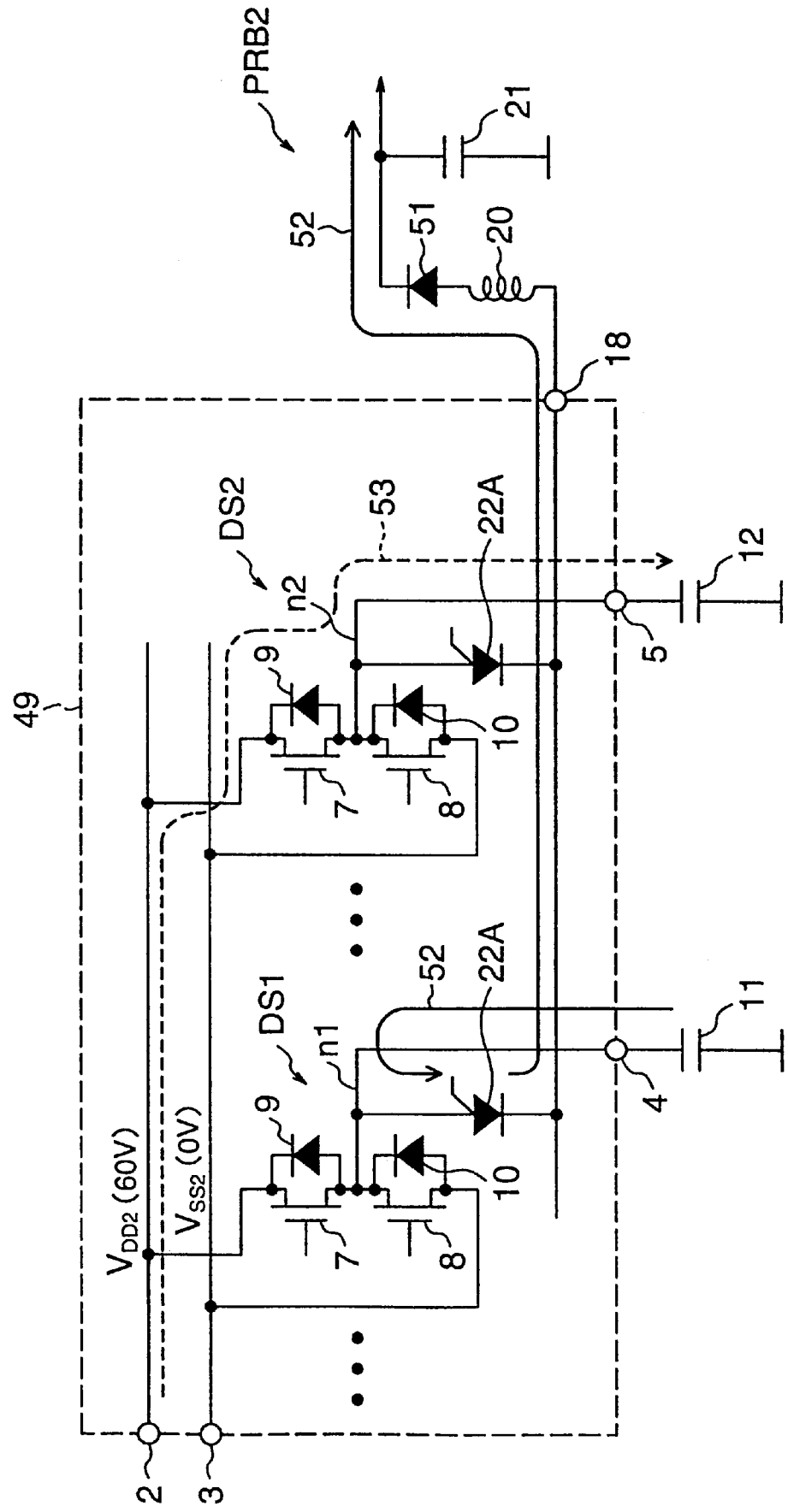
FIG. 8 is a schematic diagram of a drive circuit according to a second embodiment of the present invention.

Referring to FIG. 8, a drive circuit, for driving scanning lines in an ELDP, according to a second embodiment of the present invention operates solely in a positive potential mode. The drive circuit of FIG. 8 is different from the first embodiment in that it has a single power recovery line 18 and an associated power recovery block PRB2, and also has a single thyristor 22A in each drive section DS1 or DS2 for recovering electric charge from an associated scanning line. The power recovery block RPB2 comprises a diode 51 having an anode connected to power recovery line 18 through a reactor 20, and a storage capacitor 21 connected between the cathode of the diode 51 and the ground.

In operation, the electric charge released from the scanning line 11 is recovered along solid line 52 through node n1, thyristor 22A, power recovery line 18, reactor 20 and diode 51 to the storage capacitor 21, whereon the electric charge is stored. The stored electric charge can be used for a power recovery by recovering the electric charge to a 5-volt source line or a 60-volt source line not shown. In the time interval when the scanning line 12 is charged in the present embodiment, all the necessary electric charge is supplied from the high potential source line VDD2 along the dotted line 53.

The resonance frequency of the power recovery block PRB2 formed by the reactor 20 and the storage capacitor 21 is designed so as to recover the power in another cycle after the cycle at which the power recovered from the scanning line is stored on the capacitor. The drive circuit of FIG. 8 can be modified so that the drive circuit can recover the power in a negative potential mode, which can be obtained by disposing the thyristor in a reversed direction.

It is generally known that the thyristor has a lower on-resistance, e.g., ⅓ compared to the on-resistance of the diode, so that the voltage rise in the output line is lowered in the present invention compared to the conventional drive circuit. The lower on-resistance also provides a lower power dissipation. A lower capacitance at the junctions of the thyristor compared to the diode also achieves an efficient power recovery compared to the conventional drive circuit, wherein electric charge is stored on the junction of the parasitic diode during the recovery of the electric charge from a scanning line.

In addition, since the thyristor can be controlled for ON/OFF thereof by a control signal applied to the gate thereof, another advantage is obtained in that a suitable timing control of the thyristor can be obtained, which enables the drive circuit to efficiently use the recovered power in other suitable elements in the LSI which may have a variety of loads having large parasitic capacitance and requiring the power supply at respective timings.

Since the above embodiments are described only for examples, the present invention is not limited to the above embodiments and various modifications or alterations can be easily made therefrom by those skilled in the art without departing from the scope of the present invention.

What is claimed is:

1. A drive circuit for driving a plurality of capacitive loads, the drive circuit comprising:

a first switching transistor, connected between a first source line and an output line wherein the output line is connected to one of the capacitive loads, for supplying electric power from the first source line to the one of the capacitive loads through the output line, a first thyristor having an anode connected to the output line, a first power recovery line connected to the cathode of the first thyristor, and a power recovering block connected to the first power recovery line for recovering the electric power supplied through the first power recovery line, wherein the power recovery block has a storage capacitor connected between a node connecting the first power recovery line with a second power recovery line and a second source line, for temporarily storing the electric power recovered from the output line.

2. A drive circuit as defined in claim 1, wherein the capacitive loads are scanning lines or data lines in a display panel.

3. A drive circuit as defined in claim 1, wherein the drive circuit operates in a positive potential mode and a negative potential mode alternately.

4. A drive circuit for driving a plurality of capacitive loads, the drive circuit comprising:

a first switching transistor, connected between a first source line and an output line wherein the output line is connected to one of the capacitive loads, for supplying electric power from the first source line to the one of the capacitive loads through the output line, a first thyristor having an anode connected to the output line, a first power recovery line connected to the cathode of the first thyristor, a power recovering block connected to the first power recovery line for recovering the electric power supplied through the first power recovery line, and a second thyristor having a cathode connected to the output line, a second power recovery line connected to the anode of the thyristor, wherein the power recovery block has a function for recovering electric charge stored on the first power recovery line to the second power recovery line.

5. A drive circuit as defined in claim 4, wherein the power recovery block comprises a storage capacitor, having a terminal connected to a node connecting the first power recovery line with the second power recovery line, for temporarily storing the electric power recovered.

6. A drive circuit as defined in claim 5, wherein the power recovery block is formed as an LC resonance circuit.

7. A drive circuit for driving a plurality of capacitive loads, the drive circuit comprising a first switching transistor, connected between a first source line and an output line wherein the output line is connected to one of the capacitive loads, for supplying electric power from the first source line to the one of the capacitive loads through the output line, a second switching transistor connected between the output line and a second source line, a first thyristor having an anode connected to the output line, a first power recovery line connected to the cathode of the first thyristor, and a power recovering block connected to the first power recovery line for recover ing the electric power supplied through the first power recovery line.

8. A drive circuit as defined in claim 7, further comprising a second thyristor having a cathode connected to the output line, a second power recovery line connected to the anode of the second thyristor, and the second power recovery line is connected to the power recovery block wherein the power recovery block has a function for recovering electric charge stored on the first power recovery line to the second power recovery line.

9. A drive circuit as defined in claim 8, wherein the power recovery block comprises a storage capacitor, having a terminal connected to a node connecting the first power recovery line with the second power recovery line, for temporarily storing the electric power recovered.

10. A drive circuit as defined in claim 9, wherein the power recovery block is formed as an LC resonance circuit.

11. A drive circuit as defined in claim 7, wherein the power recovery block has a storage capacitor connected between a node connecting the first power recovery line with a second power recovery line and the second source line, for temporarily storing the electric power recovered from the output line.

12. A drive circuit as defined in claim 7, wherein the capacitive loads are scanning lines or data lines in a display panel.

13. A drive circuit as defined in claim 12, wherein the drive circuit operates in a positive potential mode and a negative potential mode alternately.

* * * * *